United States Patent
Furuya

(10) Patent No.: US 7,854,824 B2
(45) Date of Patent: Dec. 21, 2010

(54) METHOD OF MANUFACTURING SEMICONDUCTOR DEVICE USING ELECTROCHEMICAL DEPOSITION WITH ELECTRIC CURRENT REVISED BY REFLECTANCE OF EVERY SUBSTRATE SURFACE AND SEMICONDUCTOR MANUFACTURING APPARATUS

(75) Inventor: Akira Furuya, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 51 days.

(21) Appl. No.: 12/068,816

(22) Filed: Feb. 12, 2008

(65) Prior Publication Data
US 2008/0206899 A1    Aug. 28, 2008

(30) Foreign Application Priority Data
Feb. 26, 2007   (JP) .............................. 2007-045496

(51) Int. Cl.
*C25D 21/12* (2006.01)
*C25D 17/00* (2006.01)
(52) U.S. Cl. ................... 204/228.7; 204/229.2; 205/82; 205/84; 438/7
(58) Field of Classification Search ............... 205/82, 205/84; 204/228.7, 229.2; 438/7
See application file for complete search history.

(56) References Cited

U.S. PATENT DOCUMENTS

| 6,275,295 B1* | 8/2001 | Sopori ................... 356/446 |
| 2003/0045100 A1* | 3/2003 | Saka et al. ............. 438/689 |
| 2005/0092610 A1* | 5/2005 | Moore .................... 205/84 |

FOREIGN PATENT DOCUMENTS

| JP | 5-186898 | 7/1993 |
| JP | 2000-204498 | 7/2000 |
| JP | 2000-315663 | 11/2000 |
| JP | 2005-307274 | 11/2005 |

OTHER PUBLICATIONS

Moffat et al., "Electrodeposition of Cu on Ru Barrier Layers for Damascene Processing", Journal of The Electrochemical Society (2006), pp. C37-C50.
Cho, et al., "Damascene Cu electrodeposition on metal organic chemical vapor deposition-grown Ru thin film barrier", J. Vac. Sci. Techno. B 22(6), Nov./Dec. 2004, pp. 2649-2653.

* cited by examiner

*Primary Examiner*—Alexa D. Neckel
*Assistant Examiner*—Nicholas A. Smith
(74) *Attorney, Agent, or Firm*—McGinn Intellectual Property Law Group, PLLC

(57) ABSTRACT

A method of manufacturing a semiconductor device includes measuring the reflectance at the surface of a semiconductor substrate provided with concave portions and deciding a deposition parameter that represents a deposition condition corresponding to the measured reflectance. Then, a metal film is formed on the semiconductor substrate under a condition corresponding to the deposition parameter.

9 Claims, 4 Drawing Sheets

| SURFACE AREA | CURRENT VALUE |
|---|---|
| $S_1$ | $I_1$ |
| $S_2$ | $I_2$ |
| $S_3$ | $I_3$ |
| ⋮ | ⋮ |

METHOD OF MANUFACTURING SEMICONDUCTOR DEVICE USING ELECTROCHEMICAL DEPOSITION WITH ELECTRIC CURRENT REVISED BY REFLECTANCE OF EVERY SUBSTRATE SURFACE AND SEMICONDUCTOR MANUFACTURING APPARATUS

BACKGROUND OF THE INVENTION

1. Field of the Invention

The present invention concerns a method of manufacturing a semiconductor device upon forming a film on the surface of a substrate formed with concave portions, and a semiconductor manufacturing apparatus.

2. Description of Related Art

In recent semiconductor devices, delay in signal transmission along interconnections restricts the device operation. The delay constant along the interconnections is represented by a product of an interconnect resistance and an inter-interconnect capacitance, and Cu of low electrical resistivity value has been used usually for interconnection materials in order to lower the interconnect resistance and increase the device operation speed.

A Cu multi-layered interconnection is formed by a damascene method. The damascene method includes a deposition step for an insulative film such as an inter-layer insulative film, a step of forming concave portions (interconnection trenches in a case of an interconnection layer or via holes in a case of via), a barrier metal deposition step, a deposition step for a thin Cu film referred to as a Cu seed, a burying step by Cu deposition using the thin Cu film as a cathode electrode for electrolytic plating, a step of removing the barrier metal and Cu deposited to the outside of the concave portions by chemical mechanical polishing (CMP), and a barrier insulative film deposition step.

In a case where holes referred to as voids are present in the Cu interconnection, since electrical properties (such as resistance, reliability, yield, etc.) are deteriorated, burying with no voids is important in Cu plating. The deposition speed in Cu plating is high near and at the bottom of the opening of the concave portion for the opening. In a case where the opening of the concave portion is closed by the lateral growing near the opening before film formation from the bottom surface reaches the upper end of the opening of the concave portion, voids are left in the film. On the other hand, in a case where the bottom surface reaches the upper end of the opening before closure of the opening, voidless Cu plating burying can be attained. Sine the voidless burying is easier as the opening is wider, a thinner film thickness for the Cu seed is more preferred and it tends to be thinner along with shrink of feature size. In recent years, it has been investigated to directly apply Cu plating on a barrier metal using the barrier metal as a seed with no deposition of the Cu seed. Among all, Ru of good adhesion with Cu has been noted as the barrier metal.

Non-patent document 1 discloses that removal of a native oxide film on Ru is important for the Cu plating film formation on the Ru seed, and satisfactory Cu film formation can be attained by reducing with deaerated sulfuric acid. Non-patent document 2 discloses that the Cu plating film formation on Ru is improved by the use of a Pd catalyst.

Patent document 1 discloses a method of detecting the instance the surface of a metal plating film is planarized by the change of the reflectance and forming the surface planar with no pattern dependency. Further, Patent documents 2 to 4 disclose means for controlling or measuring the plating thickness by measuring the presence or absence of a reflection light or the intensity of the reflection light at the plated surface.

[Patent document 1] Japanese Patent-Laid Open Publication No. 2000-315663
[Patent document 2] Japanese Patent-Laid Open Publication No. 2000-204498
[Patent document 3] Japanese Patent-Laid Open Publication No. 05(1993)-186898
[Patent document 4] Japanese Patent-Laid Open Publication No. 2005-307274
[Non-patent document 1] T. P. Moffat et. al., J. Electrochem, Soc. 153(1), C37-C50 (2006)
[Non-patent document 2] Sung Ki Cho et. al., J. Vac. Sci. Technol. B 22(6), 2004, pp. 2649-2653

However, the related arts described in the documents above still leave room for improvement with respective to the following points.

The subject in the related art includes that a recipe has to be prepared for every product in accordance with its surface area of the film to be formed. In a case where the surface area is different on every wafer or product, the number of recipes increases to result in complexity and a burden on recipe control increases. Specifically, the number of recipes to be controlled in apparatus increases, which increases the control burden in a factory of specifying a recipe to the apparatus while judging products.

For example, the Cu plating film formation proceeds in the order of forming growing nuclei (hereinafter simply referred to as nuclei) on a seed, coalescence of nuclei, and formation of a continuous film. Under the condition where nuclei are difficult to be formed and the in-plane density of nuclei is low, growing proceeds isometrically around the nuclei as the center, a gap is formed between nuclei to be coalesced to result in a coarse film. Accordingly, it is desirable that the in-plane density of nuclei is high. The nuclei forming density increases along with increase in the current density and is saturated at a current density of a certain level or higher (hereinafter the current density is referred to as a saturation current density). That is, a coarse film is formed unless the current density is higher than the saturation current density. On the other hand, in a case where the current density is excessively high, hydrogen is generated to result in a problem such as increase in the fragility of a plating film. Accordingly, it is necessary to control the plating current density to higher than the saturation current density and lower than a hydrogen generating current density.

By the way, the dimension and the density of the concave portions change on every product and, correspondingly, the surface area of the seed also changes. This is because it is desired that the seed film is formed conformably corresponding to the unevenness on the surface. While the change of the surface area tends to increase along with shrink of feature size, it is up to about 5 times at the maximum in the 32 nm generation relative to a blanket film formed on a bare wafer. In a case where the surface area increases for an identical current value, the current density possibly lowers to below the saturation current density. On the contrary, in a case where the surface area decreases for an identical current value, the current density possibly increases to higher than the hydrogen generating current density. In the prior arts described in the documents above, since the current value for each of the steps has no relation with the reflectance, it cannot cope with the change of the surface area due to the change of the pattern to sometimes result in film formation failure such as burying failure.

In patent document 1, since burying is confirmed by measuring the reflectance after plating film formation, it cannot cope with the change of the surface area due to the change of the pattern for the concave portions. In the same manner, since patent documents 2 to 4 also monitor the plating thickness or the like by measuring the reflectance at the plated surface after plating film formation, they cannot cope with the change of the surface area on every wafer.

Accordingly, in such documents, it is necessary to prepare a different recipe in accordance with every product.

SUMMARY OF THE INVENTION

A method of manufacturing a semiconductor device includes measuring the reflectance at the surface of a semiconductor substrate provided with concave portions and deciding a deposition parameter that represents a deposition condition corresponding to the measured reflectance. Then, a metal film is formed on the semiconductor substrate under a condition corresponding to the deposition parameter.

As shown in FIG. 2, the reflectance can be represented as a function of a surface area. Accordingly, by acquiring a deposition parameter representing a deposition condition corresponding to the reflectance, the deposition condition taking the surface area into consideration can be set. In the invention, since the reflectance at the surface of the substrate is measured before film formation to properly acquire a deposition parameter representing preferred deposition condition, film formation can be controlled at a good accuracy even for a substrate of various pattern densities. Further, there is no requirement for preparing a recipe on every wafer or product and the deposition processing or the recipe can be simplified.

Further, there is provided a method of manufacturing a semiconductor device of deciding a deposition parameter by further taking the kind of a seed film into consideration in the step of deciding the deposition parameter.

In a case where the kind of the seed film is different on every wafer, by deciding the deposition parameter corresponding to the reflectance of the substrate, more suitable deposition condition can be set. By also taking the kind of the seed film into consideration, the accuracy for film formation is further improved.

Further, the present invention provides a semiconductor manufacturing apparatus for forming a film of a metal on the surface of a substrate including: a measuring section for measuring the reflectance at the surface of the substrate before film formation, a calculation section for deriving a surface area based on the reflectance measured by the measuring section, a memory section for storing the surface area derived by the calculation section, a control table relating a predetermined surface area to a predetermined deposition parameter representing a deposition condition, and a processing control section for acquiring the surface area from the memory section and specifying a deposition parameter corresponding to the surface area with reference to the control table, and a processing section for conducting film formation under the condition to the deposition parameter specified by the processing control section.

Further, a semiconductor manufacturing apparatus as an aspect of the present invention, includes a measuring section which measures a reflectance at a surface of the substrate, a memory section which stores, as a data, the measured reflectance or a surface area corresponding to the measured reflectance, a control table which relates a plurality of surface area or a plurality of reflectance to a respective deposition parameter, a processing control section which specifies a deposition parameter corresponding to the data with reference to the control table, and a processing section which conducts a film formation, by using the deposition parameter specified by the processing control section.

According to the aspect, by measuring the reflectance at the surface of the substrate before film formation, a suitable deposition parameter can be decided in accordance with an effective surface area. Accordingly, by conducting film formation under the condition corresponding to the deposition parameter decided according to the invention, film formation at good accuracy in accordance with the surface area of the substrate can be attained. Further, since there is no more necessary to provide a processing recipe on every substrate surface area, the control burden can be mitigated.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Embodiment

FIG. 1 is a cross sectional view for the step showing manufacturing procedures for a semiconductor device 100 in this embodiment.

In this embodiment, a step for forming an interconnection to an inter-layer insulative film 106 is to be described. In FIG. 1, while description is made for the procedures forming a copper interconnection with reference to a single damascene method as an example, the method of this embodiment is applicable in the same manner also to a dual damascene method.

The semiconductor device 100 includes a silicon substrate 102 formed with transistors, etc., a first inter-layer insulative film 104 formed on the silicon substrate 102, and a second inter-layer insulative film 106 formed thereon. Interconnections and vias are formed in the first inter-layer insulative film 104 and the second inter-layer insulative film 106.

Figure 1A:
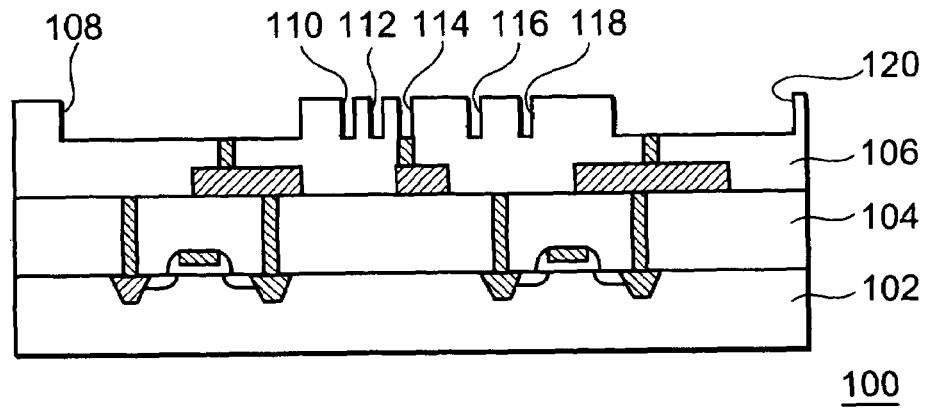
FIGS. 1A to 1C are cross sectional views showing manufacturing procedures of a semiconductor manufacturing apparatus in an embodiment of the invention.
Figure 1B:
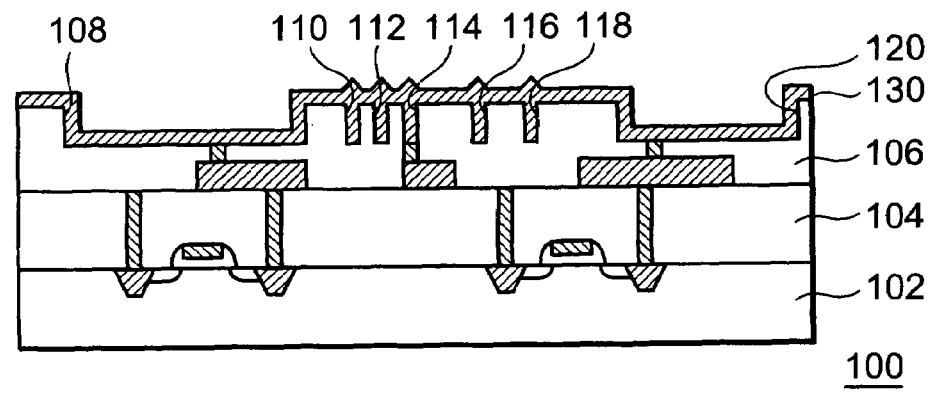
Figure 1C:
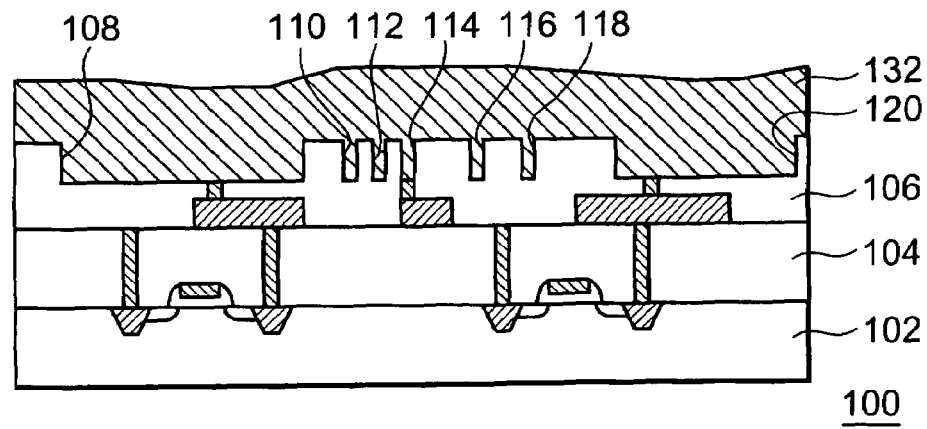

At first, concave portions are formed in the second inter-layer insulative film 106 by conducting etching selectively (FIG. 1A). While the concave portion referred to herein is, for example, an interconnection trench, this is not restrictive but may be a contact hole, a via hole, etc. As shown in FIG. 1A, a plurality of interconnection trenches 108, 110, 112, 114, 116, 118, and 120 are formed in the second inter-layer insulative film 106.

The interconnection trenches 110, 112, 114, 116, and 118 are formed in a fine pattern and the interconnection width is, for example, 0.3 μm. The interconnection trenches 108 and 120 have larger width than the interconnection trenches described formed with the fine pattern.

Procedures for film formation in such interconnection trenches are, for example, as described below. In this embodiment, a method of burying interconnection materials by electrolytic plating is described as an example of the deposition procedures. At first, a barrier metal film is formed (not illustrated) in the concave portion of the second inter-layer insulative film 106. The barrier metal film can be, for example, TaN/Ta which is used usually as a barrier metal for copper metal interconnection. Successively, a seed film for electrolytic plating is formed on the barrier film (not illustrated). In this case, the seed film can be a copper (Cu) film or the like formed, for example, by a CVD method. In addition to Cu, a material containing at least one element selected from the group consisting of Ru, Pt, Pd, Rh, Ir, Ag, Te, and Tc as a main ingredient may also be used as the seed film. Further, in this embodiment, while the barrier metal film is formed and, successively, the seed film for electrolytic plating is formed on the barrier film, electrolytic plating film may be conducted directly on the barrier metal by the barrier metal may be used as the seed. In a case where the barrier metal serves also as the seed, the same materials as those for the seed film described previously such as Ru can be used for the barrier metal.

Successively, the reflectance at the surface of the semiconductor substrate provided with the concave portions is measured before film formation. As means for measuring the reflectance, while known means can be used with no particular restriction, it is measured, for example, by a light detector having a light emission part for irradiating a light to a semiconductor substrate and a photoreceiving part for detecting the light reflected from the semiconductor substrate.

Then, a deposition parameter representing a deposition condition corresponding to the measured reflectance is decided. The deposition parameter is a parameter used as the deposition condition in the subsequent deposition step of the semiconductor substrate. In this embodiment, a film is formed by electrolytic plating in the deposition step. Accordingly, the deposition parameter is a plating condition upon conducting electrolytic plating and this is at least one selected, for example, from a value of current supplied to a plating solution, a voltage value, a current density, a deposition time, etc. The deposition parameter corresponding to the reflectance may be one parameter or plural parameter. In this embodiment, a value for the current supplied to the plating solution upon conducting electrolytic plating is decided based on the reflectance. The deposition parameter corresponding to the reflectance is acquired from a control table by providing the control table, for example, relating the predetermined surface area and the predetermined deposition parameter.

In the semiconductor substrate, the dimension and the density of the concave portions change on every product, and, correspondingly, the surface area of the substrate changes. When the surface area of the surface to be formed with the film changes, it is necessary that the deposition condition is also changed correspondingly. Accordingly, a deposition recipe has to be prepared usually on every product. In a case where the deposition recipe is not prepared on every product, it may be a possibility of causing problems such as formation of coarse films, generation of burying failure, increase in the fragility of the film.

In this embodiment, even in a case where the side wall area for the concave portion formed on the substrate is large, and the effect thereof is not negligible, film formation can be conducted under the deposition condition corresponding to the surface area by measuring the reflectance at the surface of the substrate before film formation. In a case of electrolytic plating processing by bottom up deposition, while the effective current density differs depending on the size of the area for the side wall of the concave portion, since a preferred current value or the like can be acquired optionally based on the reflectance in accordance with the surface area in this embodiment, control for the film deposition such as film thickness of semiconductor devices of various pattern densities can be conducted at a high accuracy. Further, there is no requirement for preparing a recipe for every wafer and deposition processing or recipe can be simplified.

After acquiring the deposition parameter corresponding to the reflectance, electrolytic plating is conducted. In this embodiment, film formation is conducted by electrolytic plating to the semiconductor substrate under the condition corresponding to the acquired deposition parameter. In this embodiment, the plating solution can be identical with those used usually for forming plating films upon copper interconnection formation. The plating solution can contain, for example, sulfuric acid, cupper, and chlorine. Further, the plating solution may also contain additives such as a suppressor, an accelerator, and a leveler. The electrolytic plating processing in this embodiment is bottom up deposition.

After the completion of the electrolytic plating step, the plating film exposed to the outside of the interconnection trench is removed to conduct planarization. Then, by further repeating formation of an inter-layer insulating film, formation of concave portion and formation of a metal film, a multilayered interconnection structure is obtained.

Figure 3:
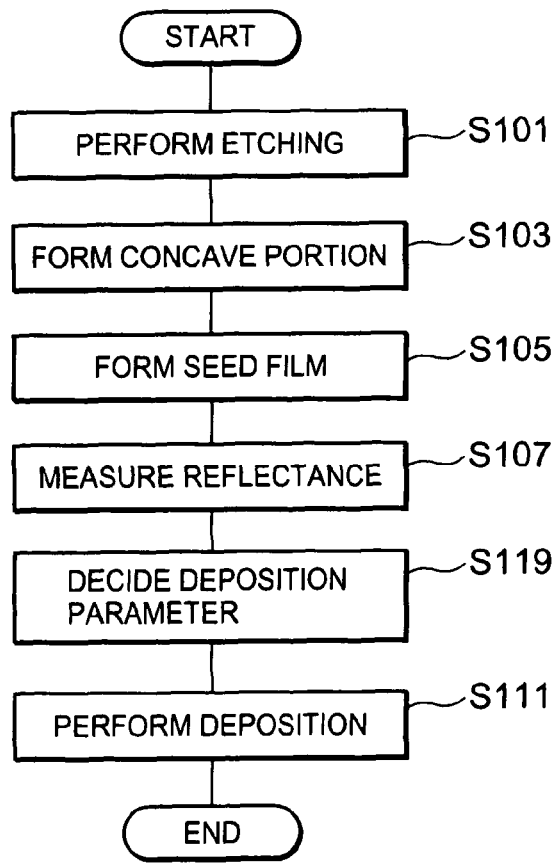
FIG. 3 is a flow chart showing deposition procedures in an embodiment of the invention.

FIG. 3 shows a flow chart showing deposition procedures in this embodiment.

Figure 2:
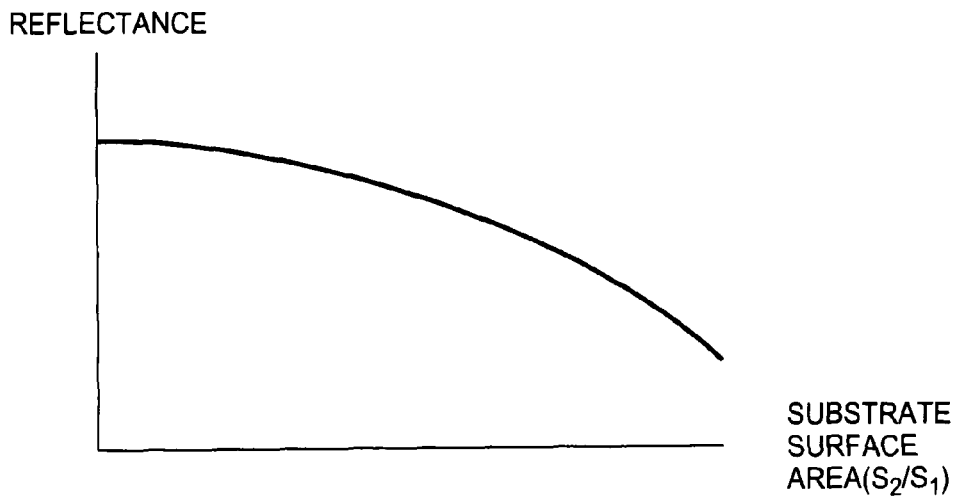
FIG. 2 is a view showing a relation between a substrate surface area and a reflectance.

FIG. 2 shows a relation between the reflectance and the surface area of a semiconductor substrate. The lateral axis shows a wafer surface area $S_2/S_1$ after forming the concave portion to the bare wafer surface area and the vertical axis shows the reflectance. S1 means the surface area of a bear substrate and S2 means the surface are of the substrate after the concave portion is formed. For an identical wafer size, the reflectance changes in accordance with the change of the surface area due to the difference in the interconnection density, the width and the number of openings, etc. Accordingly, the reflectance can be represented as a function of the surface area, and the surface area of the semiconductor substrate can be derived based on the reflectance. That is, there is a relation that the surface area is determined when the reflectance is determined. The deposition parameter corresponding to the reflectance may be decided directly based on the reflectance, or may be decided by deriving the surface area from the reflectance.

Further, instead of deriving the surface area based on the reflectance, a function for the surface area may also be derived. The deposition parameter corresponding to the reflectance is used herein in the meaning also including the deposition parameter corresponding to the surface area or the function of the surface area. In this way, a preferred deposition condition can be set in accordance with the surface area of the semiconductor substrate based on the reflectance.

Second Embodiment

In this embodiment, a mode of deciding the deposition parameter corresponding to the reflectance also taking the kind of the metal of the seed film into consideration is to be described.

Steps up to measurement for the reflectance at the surface of the silicon substrate 102 provided with the concave portions before film formation are conducted in the same manner as in the first embodiment. Then, a deposition parameter corresponding to the measured reflectance is decided. The deposition parameter is acquired from a control table by providing a control table relating a predetermined reflectance and a predetermined deposition parameter in the same manner as in the first embodiment, and such control tables are provided in this embodiment. The plurality of control tables are separate control tables for relating the kind and reflectance of predetermined seed films and the deposition parameter. Upon deciding the deposition parameter, a control table corresponding to the kind of the seed film used is selected among plurality of control tables and the deposition parameter representing the deposition condition corresponding to the reflectance is acquired based on the selected control table. After deciding the deposition parameter, film formation is conducted for the semiconductor substrate under the condition corresponding to the deposition parameter.

The deposition parameter representing the deposition condition is preferably changed while taking the kind of the seed film into consideration. In a case of the Cu seed, the saturation current density is sufficiently low relative to the hydrogen generating current density and the margin for the current density is wide. Conversely, a margin for the surface area where the current density can be made higher than the saturation current density and lower than the hydrogen generating current density is wide in a case of fixing a plating current value. In a case of the Cu seed, it is within a range of the margin so long as the change is about 10 times.

On the contrary, in a case of the barrier metal seed, the margin for the current density is narrow since the saturation current density is high. In other words, a margin for the surface area where the current density can be made to higher than the saturation current density and lower than the hydrogen generating current density is narrow in a case of fixing the plating current value. In a case where the current value in the burying step is set without considering the surface area on every product, particularly in a case of using a high resistance seed such as made of Ru, there may be a high possibility of causing burying failure.

As described above, since the saturation current density is different upon electrolytic plating depending on the material of the seed film, there is also a difference for the margin of the current density. Further, the reflectance also changes depending on the material. Accordingly, in a case where the kind of the seed is different on every wafer, there is a further higher requirement for setting the current density or the like while considering the substrate surface area. However, as described above, when it is intended to take the surface area into consideration on every product, this results in a requirement of preparing the deposition recipe on every product, which increases the number of recipes to result in the complexity and increase the control burden.

On the other hand, in this embodiment, since the control table is provided on every kind of the metal of the seed film, and the deposition parameter corresponding to the reflectance of the substrate surface area is decided based on the control table corresponding to the metal used, an appropriate deposition condition can be set in accordance with the kind of the seed film. Accordingly, even in a case of using a metal of narrow margin for the current density, an appropriate current value can be set to prevent film formation failure such as burying failure. Further, even in a case where the kind of the seed film is different on every wafer, since there is no requirement for preparing the recipe in accordance with the kind of the seed, film formation can be conducted at a high accuracy in accordance with the seed film while mitigating the control burden.

While this embodiment is particularly effective for solving the subject on the high resistance seed such as made of the Ru seed, this is not restricted to the utilization of the high resistance seed but it is also effective when used to a low resistance seed such as made of Cu, for example, with an aim of improving the controllability of the film quality.

Third Embodiment

In this embodiment, a mode of conducting electrolytic plating in multistages is described.

Steps as far as deciding the deposition parameter corresponding to the reflectance are conducted in the same manner as in the first embodiment, and a current value is decided as the deposition parameter. A current value decided being corresponded to the reflectance is defined as the first current value.

Then, electrolytic plating is applied to the surface of the silicon substrate 102. In this embodiment, the electrolytic plating step includes a step of burying a fine pattern of burying fine pattern interconnection trenches 110, 112, 114, 116, and 118 each having a predetermined width or less, and a field burying step of burying interconnection trenches 108 and 120 having a width larger than that of the fine pattern interconnection trench. In the step of burying the fine pattern, a first current value which is decided corresponding to the reflectance is used. When a first plating film 130 is formed to complete burying of the fine pattern, the step of burying the fine pattern is completed (FIG. 1(b)). After burying the fine pattern, the field burying step is conducted by using a second current value. When a second plating film 132 is formed to complete the electrolytic plating processing with the second current value, the electrolytic plating step is completed (FIG. 1(c)). In this case, the second current value may be set without measuring the reflectance or may be set by measuring the reflectance again in the course of the electrolytic plating as a deposition parameter corresponding to the reflectance.

Further, the current value acquired corresponding to the reflectance may be used at any stage in the burying step. This is because a current value corresponding to the reflectance may also be used in the course of the fine pattern burying step in a case of conducting special bath entry. Further, two or more kinds of current values acquired corresponding to the reflectance may be used in the fine pattern burying step. For example, the current value may be switched between film formation on the seed film such as made of Ru and film formation on Cu after formation of the Cu continuous film on the Ru seed film in the fine pattern burying step. In this case, the current value upon forming the Cu film on Ru is usually set higher. Accordingly, after forming the Cu continuous film, it is in the form of an existent system of forming the Cu film on Cu for which the current value is preferably switched. In this case, one of the current values may be a fixed current which is set not based on the reflectance, or each of them may be a current value corresponding to the reflectance.

Further, a time till burying with a conductive material into the fine concave part is completed may be set previously, and it can be judged whether the burying is completed or not based on whether the time has elapsed or not. For example, the step of burying the fine pattern can be set to about 50 sec to 80 sec, and the field burying step can be set to about 20 sec to 50 sec. Such processing time is an example, and can be set properly for obtaining a desired film thickness.

Fourth Embodiment

Then, an example for the constitution of a semiconductor manufacturing apparatus that conducts the deposition processing described in the first embodiment is to be described.

Figures 4, 5:
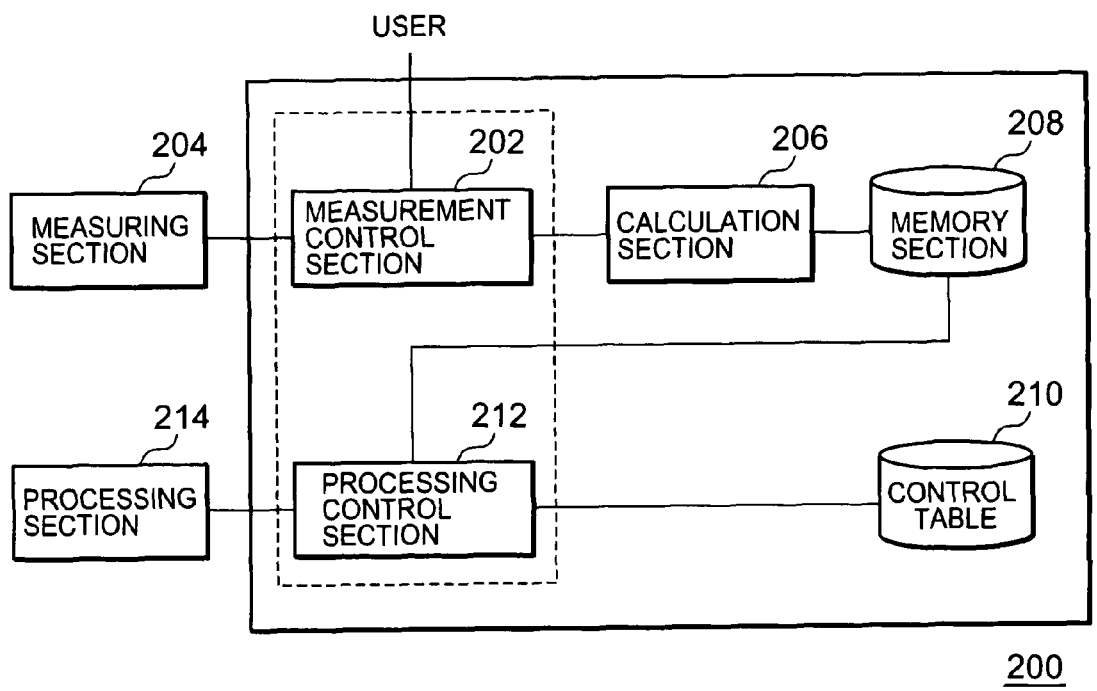
FIG. 4 is a block diagram showing a constitutional example of a semiconductor manufacturing apparatus in an embodiment of the invention.
FIG. 5 is a view showing a control table in the embodiment of the invention.

FIG. 4 is a block diagram showing the constitution of a semiconductor manufacturing apparatus 200 in this embodiment.

The semiconductor manufacturing apparatus 200 is a semiconductor manufacturing apparatus forming a film of a metal on the surface of a semiconductor substrate and includes measurement control section 202, a measuring section 204 for measuring the reflectance at the surface of the semiconductor substrate, a calculation section 206 for deriving the surface area based on the reflectance, a memory section 208 for storing the surface area, a control table 210 for relating a predetermined surface area and a predetermined deposition parameter representing a deposition condition, a processing control section 212 for acquiring the surface area from the memory section and specifying a deposition parameter corresponding to the surface area with reference to the control table, and a processing section 214 for conducting film formation under the condition corresponding to the deposition parameter.

The measurement control section 202 receives a measuring instruction from a user and controls a measurement for the reflectance. Specifically, an instruction operation of the user is input to an input section (not illustrated), and the measuring instruction is input by way of the input section to the measurement control section 202.

The measuring section 204 receives the measuring instruction from the measurement control section 202 and measures the reflectance at the surface of the substrate before film formation. The measuring section 204 includes, for example, a photodetector having a light emitting section for irradiating the light to the semiconductor substrate and a photoreceiving section for detecting a light reflected from the semiconductor substrate. The reflectance measured by the measuring section 204 is sent by way of the measurement control section 202 to the calculation section 206.

The calculation section 206 derives the surface area based on the reflectance at the surface of the substrate measured by the measuring section 204. In this case, the reflectance is represented by a function of the surface area of the semiconductor substrate as shown in FIG. 2 and the substrate surface area can be derived based on the reflectance. The surface area derived by the calculation section 206 may also be a function of the surface area and means herein also the function of the surface area. The surface area derived by the calculation section 206 is sent to and stored in the memory section 208.

The semiconductor manufacturing apparatus in this embodiment includes the control table 210 for relating a predetermined surface area and a predetermined deposition parameter representing the deposition condition. The deposition parameter represents a deposition condition as described above, which is, for example, a value of a current supplied to a plating solution. FIG. 5 shows an example of the control table 210 that stores a value of a current supplied to the plating solution in relation with a predetermined surface area. The surface area and the current value are related such that one current value is decided or to one surface area in a unique manner.

The processing control section 212, when receiving the deposition instruction of the measurement control section 202 or the input section (not illustrated), acquires a surface area from the memory section 208 and specifies a deposition parameter representing a deposition condition corresponding to the surface area with reference to the control table 210. For example, in a case where a value that agrees with the value of the surface area which is derived based on the reflectance is not present in the control table, the processing control section 212 refers to a value of the surface area nearest to that stored in the control table. In this case, the processing control section 212 specifies a current value corresponding to the value of the surface area nearest to the surface area that is derived based on the reflectance. The processing control section 212 sends an instruction for conducting film formation based on the specified deposition parameter to the processing section 214.

The processing section 214 receives a deposition instruction from the processing control section 212 and conducts film formation under the condition corresponding to the deposition parameter specified by the processing control section 212.

Film formation is started, for example, when the deposition instruction is automatically delivered from the measurement control section 202 to the processing control section 212 by the input of the instruction operation for the measurement of the user's reflectance to the input section (not illustrated). Alternatively, film formation may also be started when the user separately inputs a deposition instruction to the input section (not illustrated) and the processing control section 212 receives the deposition instruction. Further, a display section may be disposed and a specified deposition parameter may be displayed on the display section. The display section reads and displays the deposition parameter specified by the processing control section 212. In this case, a user may decide whether film formation is to be executed or not by observing the displayed deposition parameter. Further, the semiconductor manufacturing apparatus of this embodiment may also have not illustrated other control means that controls other deposition conditions than the deposition parameter which is decided corresponding to the surface area.

As described above, since the reflectance can be represented as a function of the surface area, the deposition condition considering the surface area can be set also in a case of directly deciding the deposition parameter based on the reflectance. Accordingly, it may be constituted so as to acquire a deposition parameter directly based on the reflectance without including the calculation section 206 for deriving the surface area based on the reflectance. In this case, the memory section 208 stores the reflectance measured by the measuring section 204 and the calculation section 206 may be omitted. Further, the control table 210 relates a predetermined reflectance and a predetermined deposition parameter that represents the deposition condition. The processing control section 212 acquires the reflectance measured by the measuring section 204 from the memory section 208, and specifies a deposition parameter corresponding to the reflectance with reference to the control table 210.

The measuring section 204 for measuring the reflectance may be added, for example, to a transferring station for semiconductor substrates. Further, the transferring station may have a function of an aligner.

According to this embodiment, since an appropriate deposition parameter is decided automatically based on the surface area on every substrate, it is not necessary for a user to set the deposition parameter on every substrate. Accordingly, it is no more necessary to provide a deposition recipe on every surface area and the burden on the recipe control can be mitigated. Further, a semiconductor manufacturing apparatus with an improved deposition accuracy can be provided.

Fifth Embodiment

Further, a constitutional example of a semiconductor manufacturing apparatus for conducting the deposition processing as described for the second embodiment is to be described.

Figure 6:
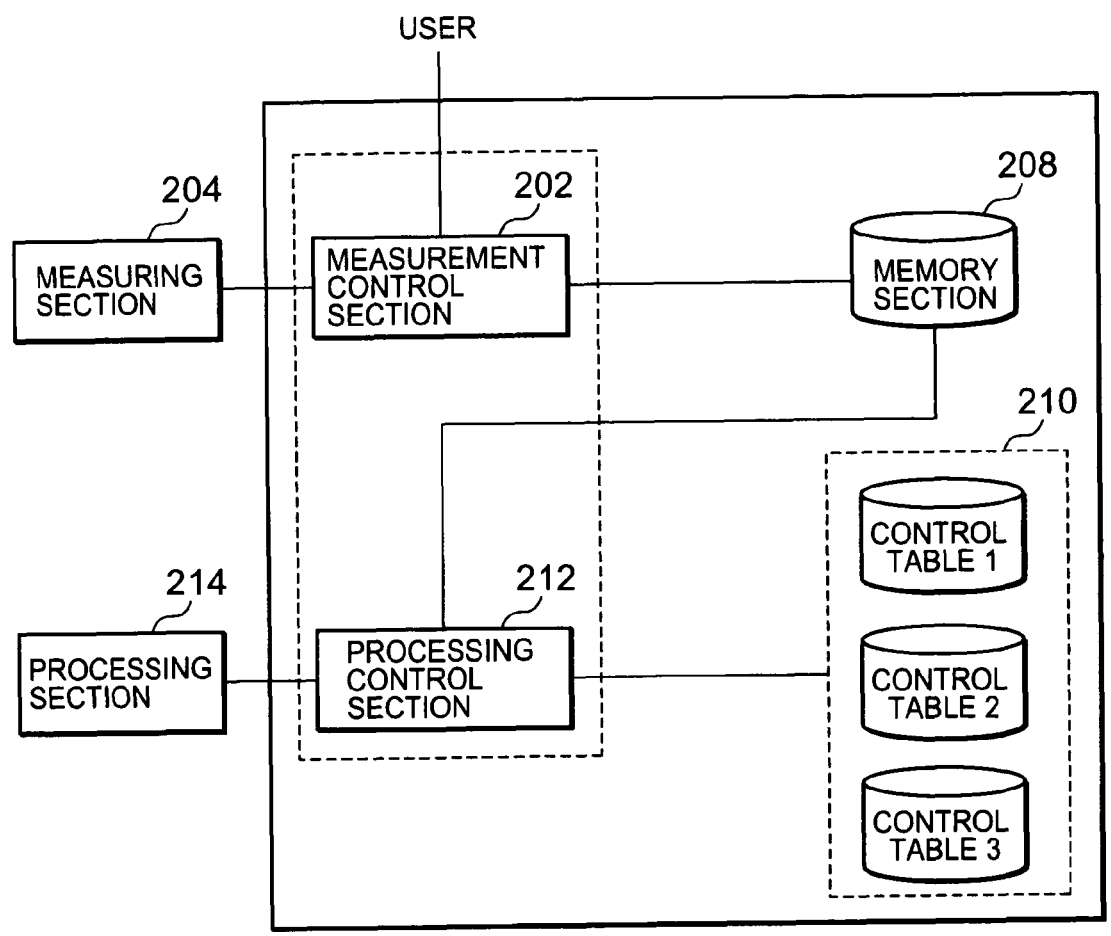
FIG. 6 is a block diagram showing another constitutional example of a semiconductor manufacturing apparatus in an embodiment of the invention.

FIG. 6 is a block diagram showing the constitution of a semiconductor manufacturing apparatus 200 in this embodiment. The semiconductor manufacturing apparatus 200 is a semiconductor manufacturing apparatus for forming a film of a metal on the surface of a semiconductor substrate like in the fourth embodiment. The semiconductor manufacturing apparatus in this embodiment has a feature in that the control table 210 comprises a plurality of control tables.

Further, different from the fourth embodiment, the semiconductor manufacturing apparatus 200 of this embodiment does not include the calculation section 206. Accordingly, the reflectance at the surface of the substrate measured by the measuring section 204 is stored by way of the measurement control section 202 in the memory section 208 without being converted into the surface area. Further, the control table 210 relates a predetermined reflectance and a predetermined deposition parameter that represents the deposition condition. The processing control section 212 receiving the deposition instruction acquires the reflectance measured by the measuring section 204 from the memory section 208 and specifies a deposition parameter corresponding to the reflectance with reference to the control table 210.

The control table 210 includes a plurality of control tables 1 to 3 which are different in accordance with the kind of the seed film. For example, a control table 1 can be a control table which is referred to in a case of using Cu as a seed film, and a control table 2 can be a control table which is referred to in a case where it is Ru. In a case where a plurality of control tables are present, a user selects, for example, the kind of the seed film simultaneously upon inputting the deposition instruction in the input section. For example, several metals for the seed film are displayed on the display section and the user selects and inputs one of the displayed metals into the input section. The information for the selected seed film is sent by way of the input section to the processing control section 212, and the processing control section 212 acquires a surface area from the memory section 208 and specifies a deposition parameter corresponding to the reflectance with reference to a control table relevant to the kind of the inputted seed film.

Since the saturation current density and the reflectance upon electrolytic plating are different depending on the metal of the seed film, it is more preferred that deposition parameters which are different depending on the metal of the seed film can be set. In this embodiment, since a control table is provided for every kind of the metal of the seed film, and the deposition parameter corresponding to the reflectance is decided with reference to the control table corresponding to the used metal, an appropriate deposition condition can be set corresponding to the kind of the seed film. Accordingly, film formation with improved accuracy can be conducted. Further, also in a case where the kind of the seed film is different on every substrate, since it is not necessary to prepare a recipe in accordance with the kind of the seed, the control burden can be mitigated.

While exemplary embodiments of the invention have been described with reference to the drawings, they are examples of the invention and various other constitutions than those described above can also be adopted.

For example, while description has been made to the electrolytic plating in the embodiments described above, this is not restrictive and other film formation can include CVD or the like.

Further, the deposition parameter is a parameter that represents the processing condition for film formation and includes, specifically, a current, supplied to a plating solution upon conducting the electrolytic plating, voltage and a current density, and a gas supply time and a gas supply amount upon conducting CVD, etc.

Further, it is noted that, Applicant's intent is to encompass equivalents of all claim elements, even if amended later during prosecution.

What is claimed is:

1. A semiconductor manufacturing apparatus, comprising:
   a measuring section which measures a reflectance at a surface of a substrate;
   a memory section which stores, as a data, the measured reflectance or an area of the surface corresponding to the measured reflectance;
   a control table which relates a plurality of areas of the surface or a plurality of reflectances to a respective deposition parameter;
   a processing control section which specifies a deposition parameter corresponding to the data with reference to the control table;
   a processing section which conducts a film formation, by using the deposition parameter specified by the processing control section; and
   a calculation section which derives the area of the surface based on the reflectance measured by the measuring section.

2. The apparatus as claimed in claim 1, wherein the control table includes a plurality of control tables in accordance with a kind of seed film.

3. The apparatus according to claim 1, wherein the processing section conducts the film formation with an electrolytic plating, and the deposition parameter comprises a value of a current supplied to a plating solution upon electrolytic plating.

4. The apparatus according to claim 1, wherein the measuring section includes a transferring station of the substrate.

5. The apparatus according to claim 4, wherein the transferring station includes a function of aligner for the substrate.

6. The semiconductor manufacturing apparatus as claimed in claim 1, wherein the processing control section specifies the deposition parameter corresponding to the area of the surface derived by the calculation section with reference to the control table.

7. A semiconductor manufacturing apparatus, comprising:
   a measuring section which measures a reflectance at a surface of a substrate;
   a calculation section which derives an area of the surface from the reflectance measured by the measuring section;
   a control table, which relates a plurality of areas of the surface to a respective deposition parameter;
   a processing control section which specifies a deposition parameter corresponding to the area of the surface derived by the calculation section with reference to the control table; and
   a processing section which conducts a film formation, by using the deposition parameter specified by the processing control section.

8. The semiconductor manufacturing apparatus according to claim 7, further comprising:
a memory section which stores, as a data, the reflectance measured by the measuring section or the area of the surface derived by the calculation section.

9. The semiconductor manufacturing apparatus according to claim 8, wherein the control table includes a plurality of control tables in accordance with a kind of seed film.

* * * * *